United States Patent
Lee et al.

(10) Patent No.: US 8,754,999 B2
(45) Date of Patent: Jun. 17, 2014

(54) LIQUID CRYSTAL DISPLAY AND METHOD FOR REPAIRING DEFECTIVE PIXEL

(75) Inventors: Sang-Kueon Lee, Asan-si (KR);
Yun-Seok Lee, Cheonan-si (KR);
Kweon-Sam Hong, Seoul (KR);
Byeong-Hee Won, Asan-si (KR)

(73) Assignee: Samsung Display Co., Ltd., Yongin (KR)

( * ) Notice: Subject to any disclaimer, the term of this patent is extended or adjusted under 35 U.S.C. 154(b) by 1013 days.

(21) Appl. No.: 12/832,508

(22) Filed: Jul. 8, 2010

(65) Prior Publication Data
US 2011/0170045 A1    Jul. 14, 2011

(30) Foreign Application Priority Data
Jan. 8, 2010    (KR) .................. 10-2010-0001947

(51) Int. Cl.
*G02F 1/1333*    (2006.01)
*G02F 1/1343*    (2006.01)

(52) U.S. Cl.
USPC ............... 349/54; 349/55; 349/139; 349/141; 349/144

(58) Field of Classification Search
CPC ................. G02F 1/136259; G02F 1/136213; G02F 2001/136263
USPC ...................... 349/54, 55, 139–144
See application file for complete search history.

(56) References Cited

U.S. PATENT DOCUMENTS

| | | | |
|---|---|---|---|
| 7,580,108 B2 * | 8/2009 | Chang et al. | 349/192 |
| 2008/0068548 A1 * | 3/2008 | Kwon et al. | 349/139 |
| 2008/0192161 A1 * | 8/2008 | Kurihara et al. | 349/39 |
| 2009/0174635 A1 * | 7/2009 | Na et al. | 345/87 |

* cited by examiner

*Primary Examiner* — Huyen Ngo
(74) *Attorney, Agent, or Firm* — H.C. Park & Associates, PLC

(57) ABSTRACT

A liquid crystal display (LCD) and a method for repairing a defective pixel in the LCD is provided, where a width of a sustain electrode line is reduced or no sustain electrode line is provided for the purpose of ensuring an increased aperture ratio. The LCD includes a gate line, extending in a first direction, and a data wiring being insulated from the gate line. The data wiring includes a source electrode, a drain electrode, and a data line extending in a second direction. A pixel electrode is connected to the drain electrode via a contact hole, and a sustain electrode line is formed in a substantially the same plane as the gate line and has a sustain electrode overlapped by the contact hole.

12 Claims, 12 Drawing Sheets

LIQUID CRYSTAL DISPLAY AND METHOD FOR REPAIRING DEFECTIVE PIXEL

CROSS-REFERENCE TO RELATED APPLICATION

This application claims priority to and the benefit of Korean Patent Application No. 10-2010-0001947 filed on Jan. 8, 2010, which is hereby incorporated by reference for all purposes as if set forth herein.

BACKGROUND OF THE INVENTION

1. Field of the Invention

Exemplary embodiments of the present invention relate to a liquid crystal display and a method for repairing a defective pixel, more particularly, to a liquid crystal display capable of performing a repair by implementing a repairing process for curing the defective pixel electrode while ensuring the maximum aperture ratio, and a method for repairing the defective pixel electrode.

2. Description of the Background

In general, a liquid crystal display (LCD) has been adopted as one of the most widely used types of flat panel displays (FPDs) attributed to several advantages, for example, a mobility with a slim and a lightweight profile, low power consumption by a low driving voltage.

The LCD typically includes a color filter substrate having a common electrode and color filters formed thereon, a thin film transistor substrate having thin film transistors and pixel electrodes, and a liquid crystal layer interposed therebetween. Different voltages are applied to the common electrode and the pixel electrodes to create an electric field in the liquid crystal layer, and arrangement of liquid crystal molecules in the liquid crystal layer varies, thereby displaying an image.

Conventionally, in order to repair a defective pixel electrode of the LCD, a sustain electrode line provides for creating storage capacitance Cst. More specifically, the defective pixel electrode is repaired by cutting a drain electrode connected to the defective pixel electrode so that the defective pixel electrode is turned into a floating state and cutting the defective pixel electrode while in the floating state from the sustain electrode line.

In general, a voltage equal to a common voltage supplied to a common electrode of a color filter substrate is also applied to a sustain electrode line. In such a manner, the common electrode and a defective pixel electrode may have the same electric potential by shorting the defective pixel electrode from a sustain electrode line, thereby converting the defective pixel electrode into an off-pixel.

An approach has been introduced to increase the aperture ratio of an LCD while significantly reducing the width of a sustain electrode line or even eliminating the sustain electrode line. This approach can be compensated for by interposing liquid crystal molecules with high dielectric constant.

However, this approach can cause defective pixel shorting problems because efforts for increasing aperture ratio are eventually lead to eliminating a sustain electrode line, which may cause difficulty in repairing defective pixels.

SUMMARY OF THE INVENTION

Exemplary embodiments of the present invention provide a liquid crystal display (LCD) capable of providing an approach to repair defective pixel electrodes by implementing a repairing process and a method for repairing process under a challenging situation where a reduction of the width of a sustain electrode line or even no sustain electrode line is provided for the purpose of ensuring to increase aperture ratio.

Exemplary embodiments of the present invention disclose a liquid crystal display. The liquid crystal display includes a gate line extending in a first direction. The liquid crystal display includes a data wiring, insulated from the gate line, comprises a source electrode, a drain electrode, and a data line. The data line extending in a second direction. The liquid crystal display further includes a pixel electrode which is coupled to the drain electrode via a contact hole. And a sustain electrode line is disposed substantially coplanar with the gate line, and the sustain electrode line comprises a sustain electrode overlapped by the contact hole.

Exemplary embodiments of the present invention disclose a method for repairing a liquid crystal display. The method includes providing a gate line extending in a first direction, wherein a data wiring, insulated from the gate line, comprises a source electrode, a drain electrode, and a data line, and the data line is extending in a second direction. The method also includes disposing a pixel electrode coupled to the drain electrode via a contact hole, wherein a sustain electrode line is disposed substantially coplanar with the gate line, and the sustain electrode is overlapped by the contact hole. The method further includes cutting the drain electrode and irradiating a laser beam into a portion where the contact hole is located so as to short the pixel electrode with the sustain electrode if the pixel electrode is determined as defective.

Exemplary embodiments of the present invention disclose a display. The display includes a gate line extending in a first direction. The display also includes a data wiring, insulated from the gate line, which comprises a source electrode, a drain electrode, and a data line, and the data wiring is extending in a second direction, wherein a pixel electrode is coupled to the drain electrode. The display further includes a sustain electrode line disposed on substantially the same plane with the data line, and the sustain electrode line comprises a sustain electrode which is overlapped by a portion of the pixel electrode.

Exemplary embodiments of the present invention disclose a method for repairing a display. The method includes providing a gate line extending in a first direction, wherein a data wiring, insulated from the gate line, comprises a source electrode, a drain electrode, and a data line, and the data line is extending in a second direction. The method also includes disposing a pixel electrode coupled to the drain electrode, wherein a sustain electrode line, disposed on substantially the same plane as the data line, comprises a sustain electrode which is overlapped by a portion of the pixel electrode. The method further includes cutting the drain electrode and irradiating a laser beam into a portion where the sustain electrode is disposed so as to short the pixel electrode with the sustain electrode if the pixel electrode is determined as defective.

Exemplary embodiments of the present invention disclose a display. The display includes a gate line extending in a first direction. The display also includes a data wiring, insulated from the gate line, comprises a source electrode, a drain electrode, and a data line, and the data line is extending in a second direction, wherein a pixel electrode is coupled to the drain electrode. The display further discloses a shielding line, disposed substantially coplanar with the pixel electrode, overlapping the data line so as to receive a common voltage, wherein a conductive pattern is disposed to couple the pixel electrode and the shielding line.

Exemplary embodiments of the present invention disclose a method for repairing a display. The method includes cutting a drain electrode and forming a conductive pattern between a pixel electrode and a shielding line to short the pixel electrode from the shielding line if a defective pixel electrode is detected. The display includes a gate line extending in a first direction, and a data wiring, insulated from the gate line, comprises a source electrode, the drain electrode, and a data line, wherein the data line extends in a second direction, and the pixel electrode is coupled to the drain electrode. And the shielding line is disposed substantially coplanar with the pixel electrode, and the data wiring is overlapped to the data line to receive a common voltage.

Exemplary embodiments of the present invention disclose a display. The display includes a substrate comprising a gate line, extending in a first direction, and a data wiring, insulated from the gate line, the data wiring comprising a source electrode, a drain electrode, and a data line, wherein the data line extends in a second direction, and a pixel electrode is coupled to the drain electrode. The display also includes a color filter substrate, comprising a common electrode, disposed facing the pixel electrode. The pixel electrode of the substrate and the common electrode of the color filter substrate comprise a conductive pattern disposed to couple the pixel electrode and the common electrode.

Exemplary embodiments of the present invention disclose a method for repairing a defective pixel electrode. The method includes providing a substrate comprising a gate line extending in a first direction, and a data wiring being insulated from the gate line comprises a source electrode, a drain electrode, and a data line, and the data line extends in a second direction, wherein a pixel electrode is coupled to the drain electrode. The method also includes disposing a color filter substrate comprising a common electrode facing the pixel electrode, wherein the drain electrode is cut. The method further includes forming a conductive pattern on at least a portion of the pixel electrode or a portion of the common electrode if a defective pixel electrode is detected, wherein the substrate and the color filter substrate are adhered to each other so as to short the pixel electrode from the common electrode by the conductive pattern.

Exemplary embodiments of the present invention disclose a display. The display includes a gate line, extending in a first direction, and a data wiring, insulated form the gate line. The data wiring comprises a source electrode, a drain electrode and a data line, and the data line extends in a second direction. The display also includes a pixel electrode coupled to the drain electrode via a contact hole, and a sustain electrode line, disposed on substantially the same plane with the gate line. And the display comprises a sustain electrode overlapped by the contact hole, wherein the drain electrode is cut and a laser beam is irradiated into a portion where the contact hole is located so as to short the pixel electrode from the sustain electrode if the pixel electrode is determined as defective.

Exemplary embodiments of the present invention disclose a display. The display includes a gate line, extending in a first direction, and a data wiring, insulated form the gate line. The data wiring comprises a source electrode, a drain electrode and a data line, the data wiring extending in a second direction. The display also includes a pixel electrode coupled to the drain electrode via a contact hole, and a sustain electrode line, disposed on substantially the same plane with the gate line. The display comprises a sustain electrode overlapped by the contact hole, wherein the drain electrode is cut and a conductive pattern is formed between the pixel electrode and a shielding line to short the pixel electrode from the shielding line if a defective pixel electrode is detected. The shielding line, disposed substantially coplanar with the pixel electrode, is overlapped the data line so as to receive a common voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
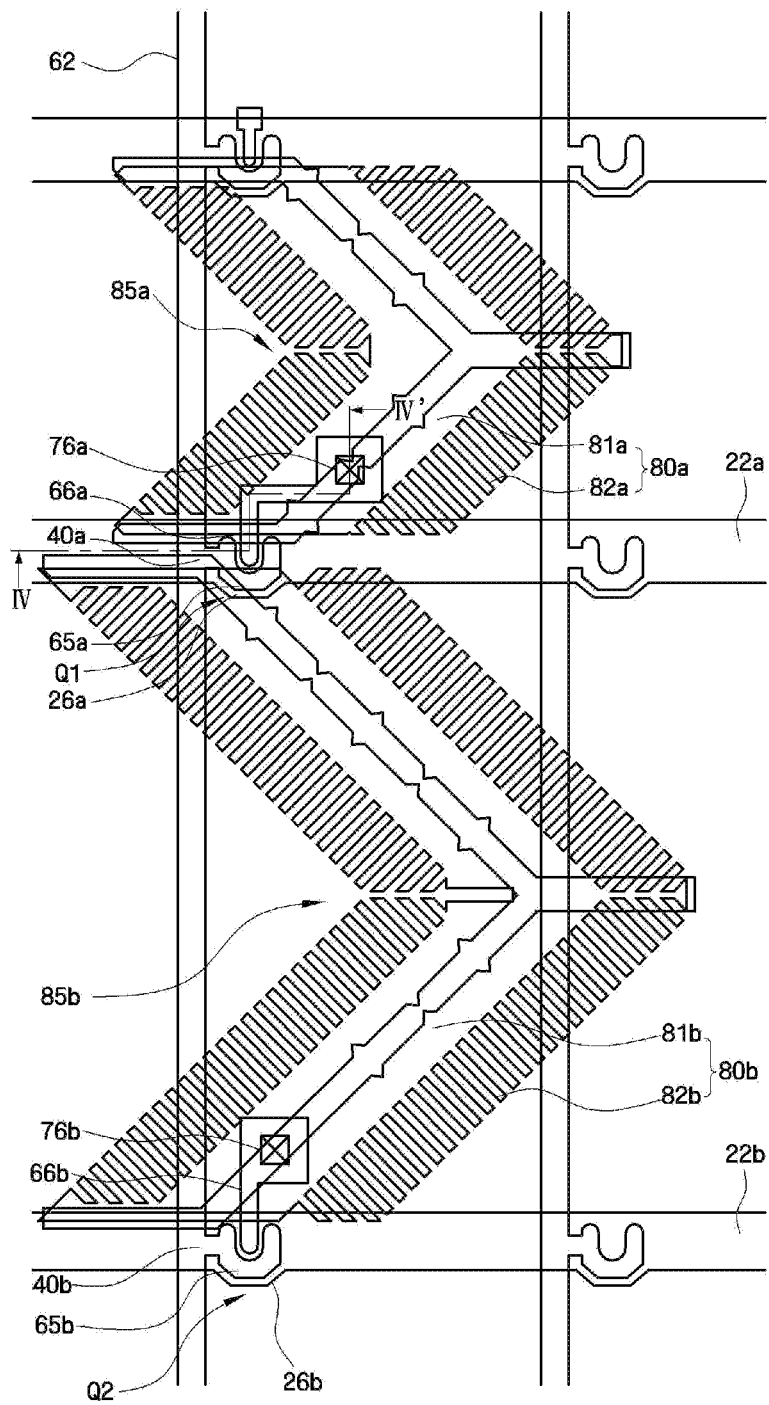
FIG. 1 is a diagram of a liquid crystal display (LCD) without sustain electrode lines, according to exemplary embodiments of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Accordingly, in some specific embodiments, well known processing steps, devices or methods will not be described in detail in order to avoid unnecessarily obscuring the invention.

It is understood that when an element or layer is referred to as being "connected to" or "coupled to" another element or layer, it can be directly on or connected to the other element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any part, and combinations of two or more parts, or combinations of all parts of the associated listed items.

It is observed that although the terms using numerical terms such as first, second, third they may be used herein to describe various elements, components, regions, layers and/or sections, these elements, components, regions, layers and/or sections should not be limited by these numerical terms. These terms are merely used to distinguish one element, component, region, layer or section from another element, component, region, layer or section. Thus, an element, a component, a region, a layer or a section designated as "first" discussed below could be interpreted as an element, a component, a region, a layer or a section designated as "second" without departing from the teachings of the present invention.

It is also noted that a terminology used for the purpose of describing exemplary embodiments is not intended to limit a scope of the invention. As used herein, the singular forms "a," "an" and "the" may include the plural forms as well, unless the context clearly indicates otherwise. It is further understood that the terms "comprises" and/or "comprising," when used in this specification, to specify features, integers, steps, operations, elements, and/or components, but cannot be interpreted to preclude an addition of one or more other features, integers, steps, operations, elements, components, and/or groups thereof.

Unless otherwise specifically being defined, all terms (including technical and scientific terms) used herein could be interpreted as the same meaning understood by one of ordinary skill in the art to which the field of the invention belongs. It is further understood that terms should be interpreted as having a meaning that is consistent with their ordinary meanings within the context and of the relevant art, and should not be interpreted in too much narrow or overly broad sense unless otherwise expressly so defined herein.

Spatially relative terms, such as "below," "beneath," "lower," "above," "upper" and the like, may be used herein for illustration of elements or spatial relationship with respect to element(s) or feature(s) as illustrated in the figures. It is observed that the spatially relative terms are relative terms and they can cover a different orientation when illustrating an element in addition to the orientation seen in the figures.

It is contemplated that a structure of a liquid crystal display (LCD) without providing sustain electrode lines and an LCD having a structure capable of performing a repair process and a method for performing of repairing process of the LCD are described with reference to the accompanying drawings. Furthermore, a method for performing of repairing an LCD without providing modified structure of the LCD is also be described.

Figure 2:
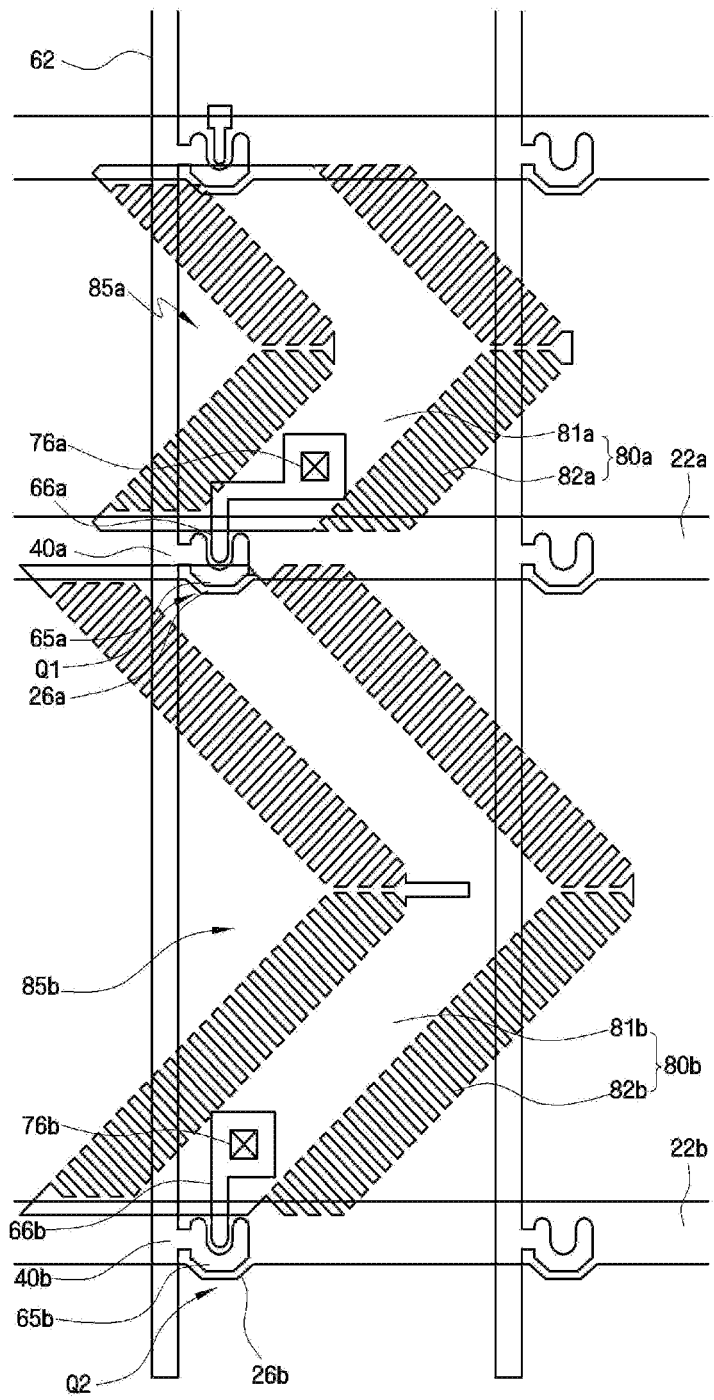
FIG. 2 is a diagram of a thin-film transistor (TFT) substrate of FIG. 1.
Figure 3:
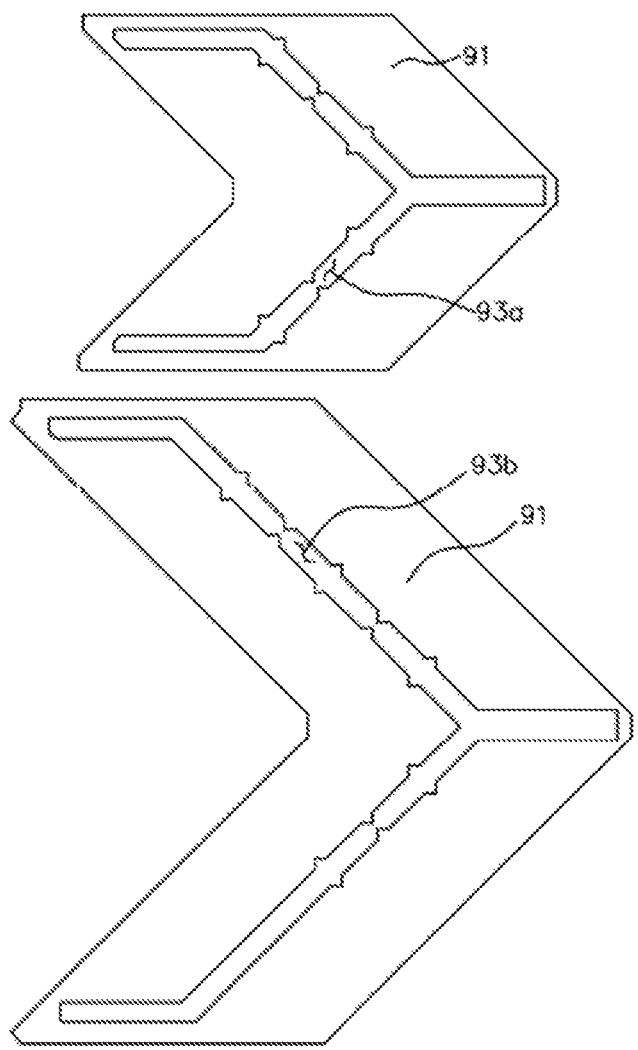
FIG. 3 is a diagram of a color filter substrate of FIG. 1.
Figure 4:
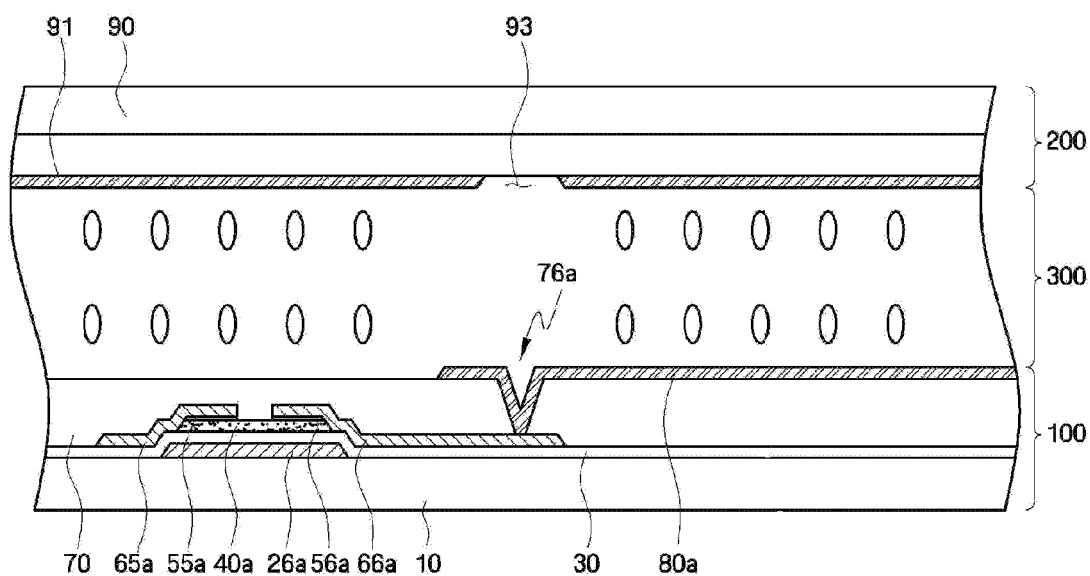
FIG. 4 is a cross-sectional view along line IV-IV' of FIG. 1.

FIG. 1 is a diagram of a liquid crystal display (LCD) capable of eliminating sustain electrode lines, according to exemplary embodiments of the present invention. FIG. 2 is a diagram of a thin-film transistor (TFT) substrate of FIG. 1. FIG. 3 is a diagram of a color filter substrate of FIG. 1, and FIG. 4 is a cross-sectional view along line IV-IV' of FIG. 1.

Referring to FIG. 1, FIG. 2, FIG. 3, and FIG. 4, an LCD may include a TFT substrate 100, a color filter substrate 200 facing the TFT substrate 100, and a liquid crystal layer 300 may be interposed between the TFT substrate 100 and the color filter substrate 200.

A first gate line 22a and a second gate line 22b extending in a horizontal direction based on a TFT substrate 100 and provided to transfer gate signals can be disposed on a first insulating substrate 10, which may include a transparent glass. The first and second gate lines 22a and 22b may extend in parallel with each other and may be allocated to each sub-pixel. In some examples, the first gate line 22a and the second gate line 22b may be a pair, which can be protruded from portions of the first gate line 22a and the second gate line 22b, respectively formed to be wide gate lines.

The first gate line 22a and second gate line 22b and the first gate electrode 26a and second gate electrode 26b may collectively be referred to as a gate wiring which may cover items of 22a, 22b, 26a, and 26b.

The gate wiring (22a, 22b, 26a, and 26b) may include an aluminum (Al)-based metal, such as aluminum or an aluminum alloy, a silver (Ag)-based metal, such as silver or a silver alloy, a copper (Cu)-based metal, such as copper or a copper alloy, a molybdenum (Mo)-based metal, such as molybdenum or a molybdenum alloy, chrome (Cr), titanium (Ti), or tantalum (Ta). In addition, the gate wiring (22a, 22b, 26a, and 26b) may have a multi-film structure, for example, including two conductive films (not shown) each of the films may have different physical characteristics. For example, one of the two conductive films may be formed of metal with low resistivity, such as an aluminum-based metal, a silver-based metal, or a copper-based metal in order to reduce a signal delay or a voltage drop of the gate wiring (22a, 22b, 26a, and 26b). The other conductive films may be formed of a different material, for example, a material having superior contact characteristics with indium tin oxide (ITO) and indium zinc oxide (IZO), such as a molybdenum-based metal, chrome, titanium, or tantalum. Examples of the multi-film structure may include a combination of a chrome lower film and an aluminum upper film and a combination of an aluminum lower film and a molybdenum upper film. However, in some examples, the gate wiring (22a, 22b, 26a, and 26b) may include various types of metal and conductors.

A gate insulating film 30, which may include silicon nitride ($SiN_x$), may be disposed on the gate wiring (22a, 22b, 26a, and 26b).

A pair of first semiconductor layer 40a and second semiconductor layer 40b, which may include hydrogenated amorphous silicon or polycrystalline silicon, can be disposed on the gate insulating film 30. The first semiconductor layer 40a and second semiconductor layer 40b, which can be used for forming thin film transistor (TFT) channels to be described later, may be formed to overlap the first gate electrode 26a and second gate electrode 26b, respectively. In some examples, the first semiconductor layer 40a and second semiconductor layer 40b may have island shapes in which the first semiconductor layer 40a and the second semiconductor layer 40b can be overlapped with the first gate electrode 26a and the second gate electrode 26a and 26b, respectively. But aspects of the exemplary embodiments of the present invention are not limited thereto. The first semiconductor layer 40a and the second semiconductor layer 40b may be formed to have substantially the same shapes as a data wiring (62, 65a, 65b, 66a, and 66b), except for channel regions of the TFTs, which is further described with respect to FIG. 1 through FIG. 4.

Ohmic contact layers 55a and 56a, which may include silicide or $n^+$ hydrogenated amorphous silicon doped with n-type impurities in high concentration, can be disposed on the first semiconductor layer 40a and the second semiconductor layer 40b, respectively. For example, a pair of the ohmic contact layers 55a and 56a can be disposed on the first semiconductor layer 40a and the second semiconductor layer 40b.

A data line 62 may be disposed on the ohmic contact layers 55a and 56a and the gate insulating film 30. The data line 62 extends in a vertical direction, crossing the first and second gate lines 22a and 22b. First source electrode 65a and second source electrode 65b can be branched out from the data line 62 toward first drain electrode 66a and second drain electrode 66b. The data line 62 can transmit a data signal to fist sub-pixel electrodes 80a and second sub-pixel electrodes 80b.

The data line 62, the first source electrode 65a and the second source electrode 65b, and the first drain electrode 66a and the second drain electrode 66b can collectively be referred to as data wiring (62, 65a, 65b, 66a, and 66b).

The data wiring (62, 65a, 65b, 66a, and 66b) may include a refractory metal such as chrome, a molybdenum-based metal, tantalum or titanium. In some examples, the data wiring (62, 65a, 65b, 66a, and 66b) may have a multi-film structure comprising a lower film (not shown), which may be formed of a refractory metal, and an upper film (not shown) which may be formed of a material with low resistivity. As described above, examples of the multi-film structure may include a combination of a chrome lower film and an aluminum upper film and a combination of an aluminum lower film and a molybdenum upper film. In some examples, the multi-film structure may be a triple-film structure having molybdenum-aluminum-molybdenum films.

The first source electrode 65a can partially overlap the first semiconductor layer 40a. The first drain electrode 66a can face the first source electrode 65a with respect to the first gate electrode 26a and can partially overlap the first semiconductor layer 40a. The ohmic contact layers 55a and 56a described above can be disposed between the first semiconductor layer 40a, which may be disposed under the ohmic contact layers 55a and 56a, and the first source electrode 65a and the first drain electrode 66a, which may be disposed above the ohmic contact layers 55a and 56a, and these dispositions may reduce contact resistance therebetween.

In some examples, the second source electrode 65b can partially overlap the second semiconductor layer 40b. For example, the second drain electrode 66b can face the second source electrode 65b with respect to the second gate electrode 26b and can partially overlap the second semiconductor layer 40b.

A passivation layer 70 can be formed on the data wiring (62, 65a, 65b, 66a, and 66b) and exposed portions of the first semiconductor layer 40a and the second semiconductor layer 40b. The passivation layer 70 may include an inorganic material, such as a silicon nitride or a silicon oxide, an organic material having photosensitivity and superior planarization characteristics, or a low-k dielectric material formed by plasma enhanced chemical vapor deposition (PECVD), such as a-Si:C:O or a-Si:O:F. For example, the passivation layer 70 may include a lower inorganic layer and an upper organic layer in order to protect the exposed portions of the first semiconductor layer 40a and second semiconductor layer 40b while taking advantages of the superior characteristics of an organic layer. For example, a red (R), green (G), or blue (B) color filter layer may be used as the passivation layer 70.

The first contact hole 76a and the second contact hole 76b can be formed in the passivation layer 70. The first sub-pixel electrode 80a can physically and electrically be connected to the first drain electrode 66a by the first contact hole 76a so that a data voltage and a control voltage can be supplied. The second sub-pixel electrode 80b can physically and electrically be connected to the second drain electrode 66b by the second contact hole 76b so that a data voltage and a control voltage can be supplied.

The first sub-pixel electrode 80a and the second sub-pixel electrode 80b, to which the data voltages can be applied, can generate an electric field together with a common electrode 91 of the color filter substrate 200 thereby determining the alignment directions of liquid crystal molecules of the liquid crystal layer 300 arranged between the first sub-pixel electrodes 80a, and the second sub-pixel electrode 80b and the common electrode 91. The first sub-pixel electrode 80a and the second sub-pixel electrode 80b can be referred to as a pixel electrode (80a, 80b).

The first sub-pixel electrode 80a can be operated by a first TFT Q1 formed as a switching device having the first gate electrode 26a, the first source electrode 65a and the first drain electrode 66a as three terminals. The first TFT Q1 can be actuated by a gate signal applied via the first gate electrode 26a. If a gate-on signal is applied to the first gate electrode 26a, a data signal can be applied to the first sub-pixel electrode 80a via the first source electrode 65a and the first drain electrode 66a.

The second sub-pixel electrode 80b can be operated by a second TFT Q2 forming a switching device comprising the second gate electrode 26b, the second source electrode 65b and the second drain electrode 66b as three terminals. The second TFT Q2 can be actuated by a gate signal applied through the second gate electrode 26b. When a gate-on signal is applied to the second gate electrode 26b, a data signal can be applied to the second sub-pixel electrode 80b via the second source electrode 65b and the second drain electrode 66b.

In some examples, the first sub-pixel electrode 80a and the second sub-pixel electrode 80b can be separated from each other with the first gate line 22a disposed therebetween, and a data signal having a higher voltage can be applied to the first sub-pixel electrode 80a than that of the second sub-pixel electrode 80b. For example, the first sub-pixel electrode 80a may be formed to have a smaller area than that of the second sub-pixel electrode 80b.

In order to increase an aperture ratio by increasing a region in which liquid crystals can effectively be controlled, the first sub-pixel electrode 80a and the second sub-pixel electrode 80b may have a first bent portion 85a and a second bent portion 85b, respectively. The first bent portion 85a can be a portion formed where the first sub-pixel electrode 80a is bent, and the second bent portion 85b can be a portion formed where the second sub-pixel electrode 80b is bent. Consequently, the pixel electrode (80a and 80b) can be formed such that the first sub-pixel electrode 80a and the second sub-pixel electrode 80b can be bent in a zigzag shape.

First micro protrusion pattern 82a and second micro protrusion pattern 82b can be formed at edges of the first sub-pixel electrode 80a and the second sub-pixel electrode 80b, respectively.

It is noted that the first micro protrusion pattern 82a and the second micro protrusion pattern 82b can affect a transmittance, a responding speed (e.g., a delay behavior of liquid crystal molecules arranged at a central portion of the pixel electrode) of an LCD, a display quality caused by spots (or stains).

The color filter substrate 200 may include second insulating substrate 90, which may include a transparent glass, and the common electrode 91 formed on the second insulating substrate 90. The common electrode 91 may include a transparent conductive material such as ITO or IZO. The common electrode 91 may face the pixel electrode (80a and 80b), and may be bent in a zigzag shape, conforming to the pixel electrode (80a and 80b).

For example, the common electrode 91 may include slit patterns 93a and 93b at portions corresponding to the respective first sub-pixel electrodes 80a and the second sub-pixel electrode 80b. The slit patterns 93a and 93b formed by patterning a portion of the common electrode 91 and do function as domain forming means. The slit patterns 93a and 93b can be disposed to overlap central portions of the first sub-pixel electrode 80a and the second sub-pixel electrodes 80b.

An alignment film (not shown), which can align the liquid crystal molecules, may be coated on the common electrode 91.

In some examples, the TFT substrate 100 and the color filter substrate 200 can be aligned and adhered to each other, and the liquid crystal layer 300 can be formed by injecting liquid crystal material therebetween, thereby completing the basic structure of the LCD.

The liquid crystal molecules in the liquid crystal layer 300 may have a director aligned perpendicular to the TFT substrate 100 and the color filter substrate 200 and may have a negative dielectric anisotropy if an electric field is not applied between the pixel electrode 80a and 80b and the common electrode 91. When an electric field is applied between the pixel electrode (80a and 80b) and the common electrode 91, the liquid crystal molecules can be inclined perpendicular to the slit patterns 93a and 93b and can be divided into a plurality of domains.

Referring to FIG. 1, FIG. 2, FIG. 3 and FIG. 4, the LCD may have a structure without sustain electrode lines. In this exemplary structure, even if a drain electrode is cut for a repair process, it cannot short circuit a sustain electrode line and a defective pixel electrode in a subsequent process. In this approach, the potential of the defective pixel electrode in the floating state may become unstable. This may result a failure in the repair process.

Thus, in order to properly implement a repair process, it is contemplated that the structure of the TFT substrate 100 illustrated in FIG. 1, FIG. 2, FIG. 3 and FIG. 4 should be modified as shown in FIG. 5, FIG. 6, FIG. 7, FIG. 8, FIG. 9, FIG. 10, FIG. 11, and FIG. 12. Using the modified structures of TFT substrate as shown in FIG. 5 through FIG. 12, the present invention can facilitate repair of an LCD yet providing an aperture ratio substantially equal to that of the LCD structure as illustrated in FIG. 1 through FIG. 4.

Figure 5:
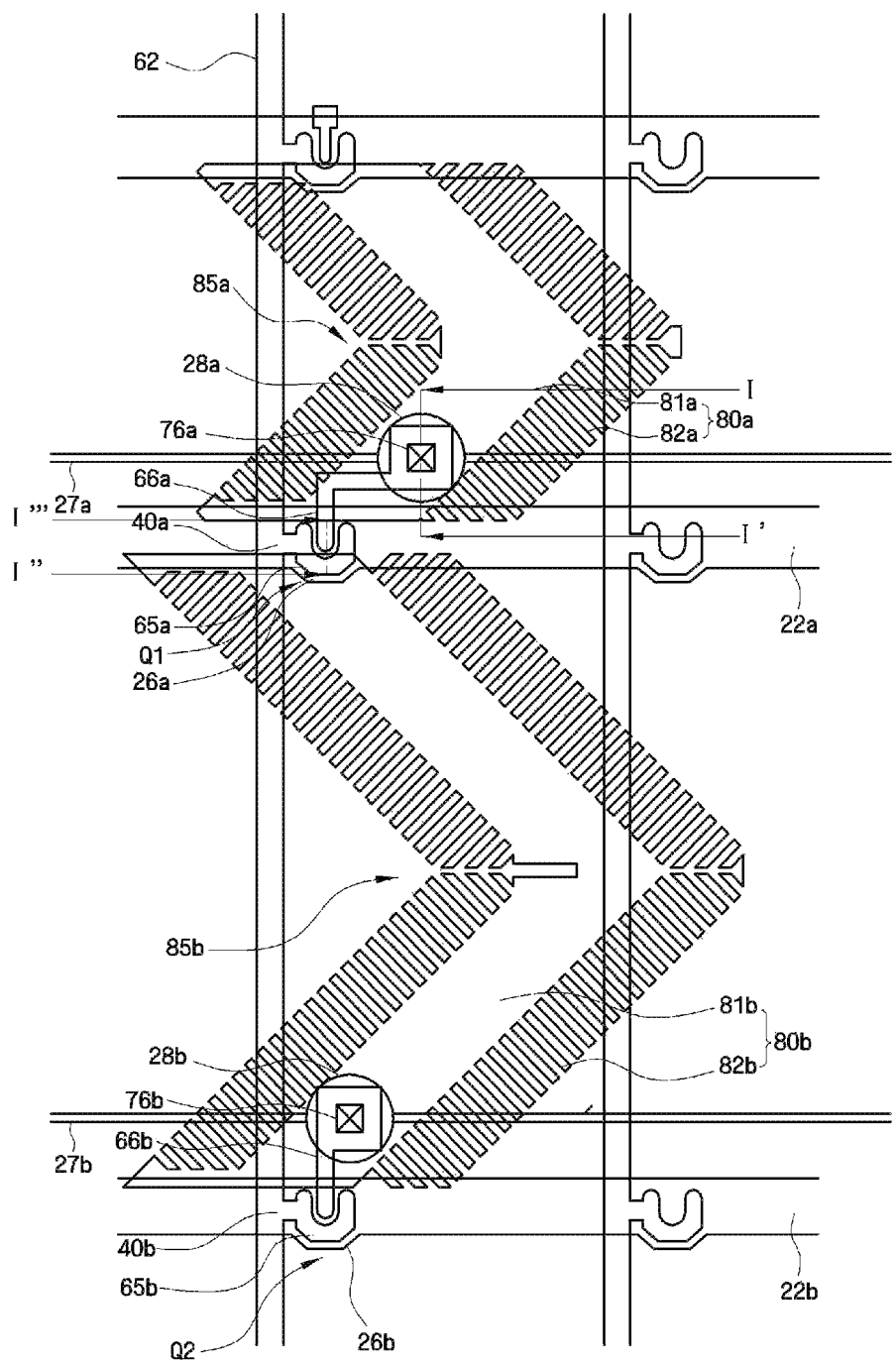
FIG. 5 is a diagram of a TFT substrate of an LCD, according to exemplary embodiments of the present invention.
Figure 6:
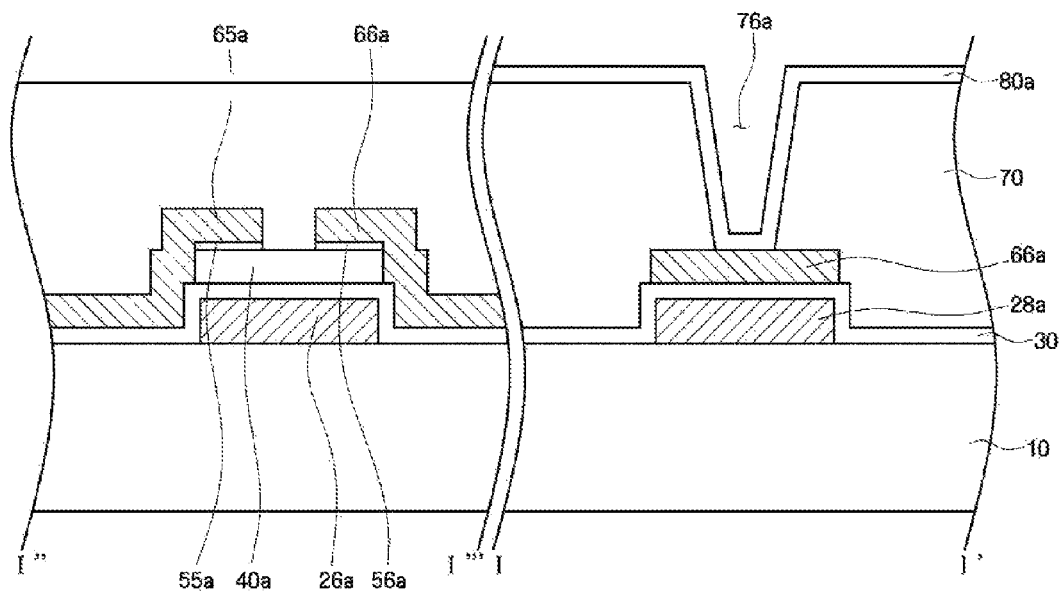
FIG. 6 is a cross-sectional view taken along lines I-I' and I"-I'" of the TFT substrate of FIG. 5.

For example, FIG. 5 illustrates an exemplary structure of a TFT substrate of an LCD and FIG. 6 is a cross-sectional view taken along lines I-I' and I"-I'" of the TFT substrate of FIG. 5. In the following, descriptions of elements identical to those in the previous embodiment shown in FIG. 1 through FIG. 4 can be omitted or simplified to avoid unnecessarily obscuring the present invention.

Referring to FIG. 5 and FIG. 6, the TFT substrate may include a first insulting substrate 10 and a gate wiring (22a, 22b, 26a, and 26b) that can be disposed on the first insulating substrate 10, and the TFT substrate may include first gate line 22a and second gate line 22b and first gate electrode 26a and second gate electrode 26b.

First sustain electrode line 27a and second sustain electrode line 27b may also be disposed over the first insulating substrate 10 in which a voltage can be applied to the first sustain line 27a and the second sustain electrode line 27b which may equal to a supply voltage applied to a common electrode 91 (hereinafter referred to as a common voltage). In some examples, the first sustain electrode line 27a may extend below a first contact hole 76a (will more fully be described later) in a transverse direction and parallel to the first gate line 22a. The second sustain electrode line 27b may extend below a second contact hole 76b (will more fully be described later) in the transverse direction and parallel to the second gate line 22b. A portion of the first sustain electrode line 27a overlapped by the first contact hole 76a and a portion of the second sustain electrode line 27b overlapped by the second contact hole 76b may respectively be referred to as first sustain electrode 28a and second sustain electrode 28b. A sustain electrode wiring (27a, 27b, 28a, and 28b) may include the first sustain electrode line 27a and second sustain electrode line 27b and the first sustain electrode 28a and the second sustain electrode 28b.

It is contemplated that the first sustain electrode line 27a and the second sustain electrode line 27b may have a minimum line width. For example, the first sustain electrode line 27a and the second sustain electrode line 27b may have a small scale of linewidth respectively because the small linewidth can be used for applying a common voltage, instead of creating storage capacitance Cst. The small linewidth can also be utilized advantageously for achieving a high aperture ratio of the LCD.

In some examples, the first sustain electrode 28a and the second sustain electrode 28b may have a circular or polygonal planar shaped linewidth, and it is desirable to have significantly greater linewidth than that of the first sustain electrode line 27a and the second sustain electrode line 27b. A large linewidth of the first sustain electrode 28a and the second sustain electrode 28b may allow to short first sub-pixel electrode 80a and second sub-pixel electrode 80b respectively from the first sustain electrode 28a and the second sustain electrode 28b by increasing overlapping areas between first sub-pixel electrode 80a and first sustain electrode 28a and between second sub-pixel electrode 80b and second sustain electrode 28b via the first contact hole 76a and the second contact hole 76b.

A gate insulating layer 30 can be disposed on the gate wiring (22a, 22b, 26a, and 26b) and the sustain electrode wiring (27a, 27b, 28a, and 28b).

First semiconductor layer 40a and second semiconductor layer 40b can be disposed on the gate insulating layer 30, and each pair of ohmic contact layers 55a and 56a can be disposed on the first semiconductor layer 40a and the second semiconductor layer 40b.

A data line 62 can be formed over a pair of the ohmic contact layers 55a and 56a and the gate insulating layer 30 and can extend longitudinally to intersect the first gate line 22a and the second gate line 22b. The data line 62 can be branched out to form a first source electrode 65a and a second source electrode 65b that can protrude toward a first drain electrode 66a and a second drain electrode 66b. The data line 62, the first source electrode 65a and second source electrode 65b, and the first drain electrode 66a and second drain electrode 66b may collectively be referred to as a data wiring (62, 65a, 65b, 66a, and 66b).

A passivation layer 70 may be formed on the data wiring (62, 65a, 65b, 66a, and 66b) and the exposed portions of the first second semiconductor layer 40a and the second semiconductor layer 40b. The passivation layer 70 may have a first contact hole 76a and a second contact hole 76b through which the first sub-pixel electrode 80a and the second sub-pixel electrode 80b can respectively be coupled to the first drain electrode 66a and the second drain electrode 66b.

A method for repairing the LCD according to exemplary embodiments will now further be described with reference to FIG. 5 and FIG. 6.

If the first sub-pixel electrodes 80a and the second sub-pixel electrode 80b are determined as defective, neck portions (having a small linewidth) of the first drain electrode 66a and second drain electrode 66b can be irradiated with a laser beam to be cut so that the first sub-pixel electrodes 80a and second sub-pixel electrode 80b can be in floating states.

Then, the first sub-pixel electrode 80a and the second sub-pixel electrode 80b can be shorted from the underlying a first sustain electrode 28a and a second sustain electrode 28b, respectively, by irradiating the first contact hole 76a and the second contact hole 76b with a laser beam. The first sub-pixel electrode 80a and the second sub-pixel electrode 80b receive a common voltage through the first sustain electrode line 27a and the second sustain electrode line 27b so that first sub-pixel electrode 80a and second sub-pixel electrode 80b may have substantially the same electric potential as that of the common electrode 91. Due to the equivalent electric potential to the common electrode 91, the first sub-pixel electrode 80a and the second sub-pixel electrode 80b can be converted into and can be treated as an off-pixel electrode.

As described above, the TFT substrate can be configured such that the first sustain electrode 28a and the second sustain electrode 28b overlapping the first contact hole 76a and the second contact hole 76b which have a circular or a polygonal shape with a large linewidth thereby facilitating electrical shorting between the first sub-pixel electrode 80a and the first sustain electrode 28a and between the second sub-pixel electrode 80b and the second sustain electrode 28b despite a fact that the first sustain electrode line 27a and the second sustain electrode line 27b may have small linewidth.

Figure 7:
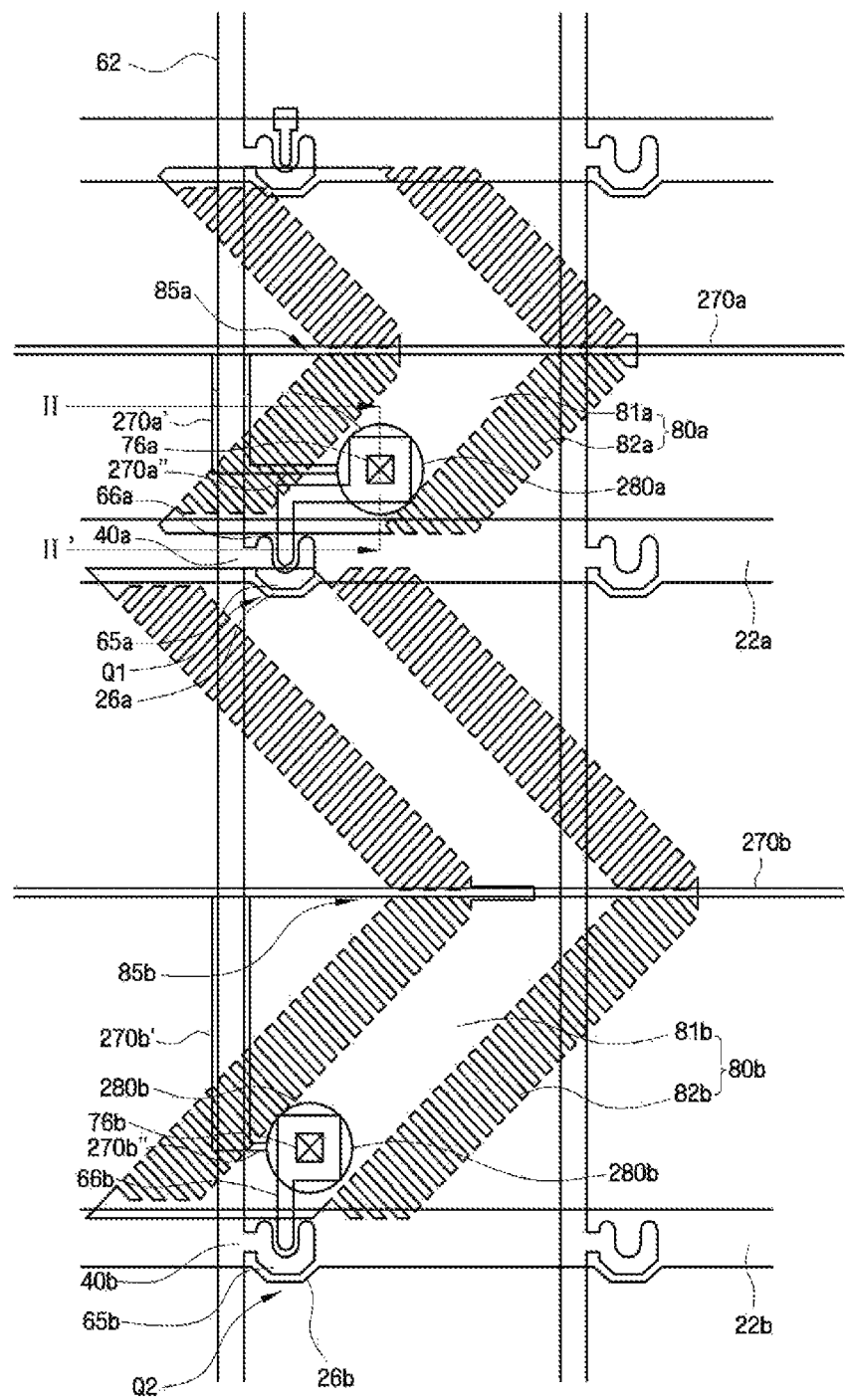
FIG. 7 is a diagram of a TFT substrate of an LCD, according to exemplary embodiments of the present invention.
Figure 8:
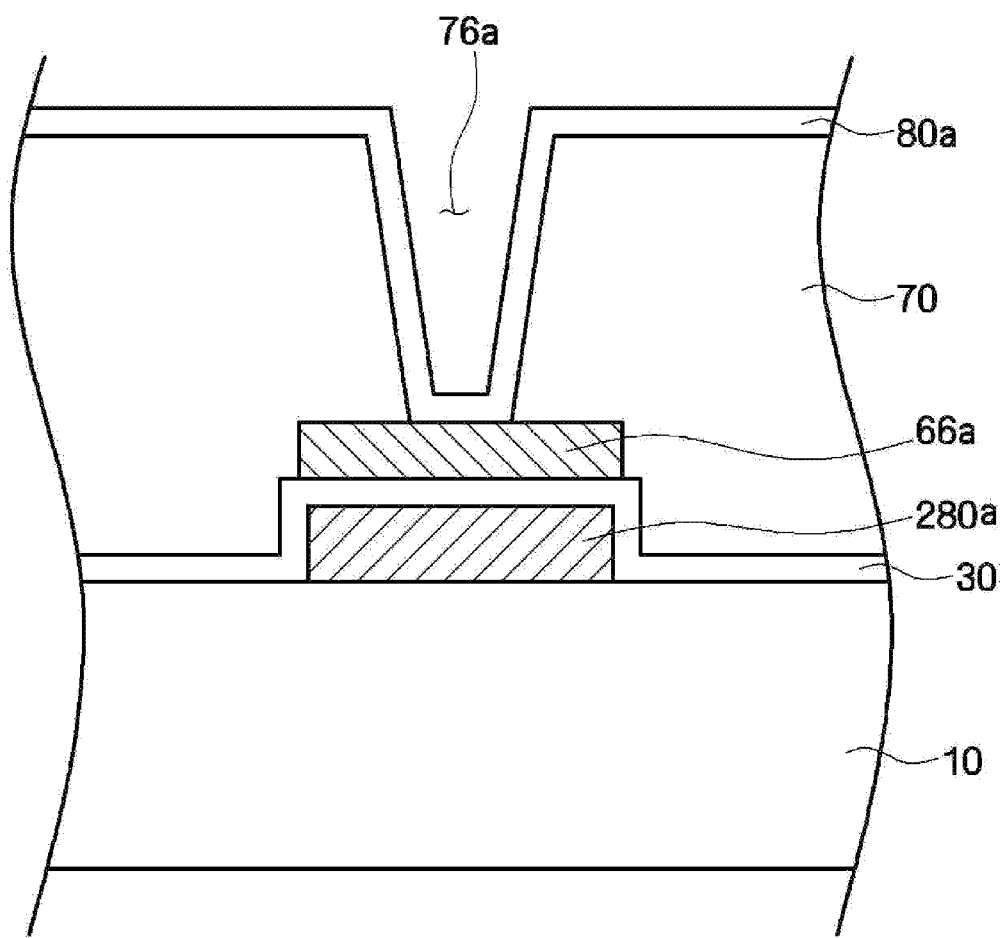
FIG. 8 is a cross-sectional view taken along line II-II' of the TFT substrate of FIG. 7.

FIG. 7 is a diagram of a TFT substrate of an LCD and FIG. 8 is a cross-sectional view taken along line II-II' of the TFT substrate of FIG. 7. In the following, any repetitive descriptions of elements identical to those in the previous embodiment shown in FIG. 1 through FIG. 4 can be omitted or simplified to avoid unnecessarily obscuring the present invention.

Referring to FIG. 7 and FIG. 8, a gate wiring (22a, 22b, 26a, and 26b) can be formed over a first insulating substrate 10 and may include first gate line 22a and second gate line 22b and first gate electrode 26a and second gate electrode 26b.

In some examples, a first sustain electrode line 270a and a second sustain electrode line 270b to which a common voltage is applied can also be disposed over the first insulating substrate 10. The first sustain electrode line 270a can be extended below a first bent portion 85a of a first sub-pixel electrode 80a in the transverse direction and can be parallel to the first gate line 22a. The second sustain electrode line 270b can be extended below a second bent portion 85b of a second sub-pixel electrode 80b in the transverse direction and can be parallel to the second gate line 22b.

It is observed that the first bent portion 85a and the second bent portion 85b of the first sub-pixel electrode 80a and the second sub-pixel electrode 80b may be considered as having a low transmittance, thus the effects to the aperture ratio and transmittance of an LCD may be trivial (i.e., slightly reduced aperture ratio) even though the first sustain electrode line 270a and the second sustain electrode line 270b can be extended across the bottom of the first bent portion 85a and second bent portion 85b.

In this example, in order to perform a short repair process, branches can be formed by extending from the first sustain electrode line 270a and the second sustain electrode line 270b to the bottoms of the first contact hole 76a and the second contact hole 76b can be formed, and a first sustain electrode 280a and a second sustain electrode 280b disposed at distal ends of the branches so as to overlap the first contact hole 76a and second contact hole, respectively can be formed. The above disposition can be accomplished due to a fact that there exist no overlapping areas between the first sustain electrode line 270a and the first contact hole 76a and between the second electrode line 270b and second contact hole 76b. For example, the branches may include first branches (270a' and 270a") and second branches (270b' and 270b,") which can be protruded from the first sustain electrode line 270a and the second sustain electrode line 270b, respectively. The first branches (270a' and 270a") and the second branches (270b' and 270b") is further described with reference to FIG. 7 and FIG. 8.

The first branches (270a' and 270a") may include a portion 270a' having one end that can be connected to the first sustain electrode line 270a and can extend in the direction that can intersect the first gate line 22a and the first sustain electrode line 270a. And the remaining portion 270a" may have one end that can be connected to the portion 270a' and can extend sideways to the first contact hole 76a and parallel to the first sustain electrode line 270a. The portion 270a' can lie below a data line 62 and can be separated from the first gate line 22a. The remaining portion 270a" has the first sustain electrode 280a which can be overlapped by the other end of the first contact hole 76a.

For example, the portion 270a' of the first branches (270a' and 270a") overlapping the data line 62 may be used as a light blocking layer. Although not shown in FIG. 7 and FIG. 8, an approach to increase the aperture ratio by reducing the area occupied by a black matrix (not shown) on a color filter substrate 200 is introduced to form a light blocking layer (not shown) on a TFT substrate 100. The light blocking layer, extending in the direction perpendicular to the gate lines (22a and 22b,) can be separated from the gate lines 22a and 22b, and can overlap the data line 62. For example, the portion 270a' can be used as a portion of the light blocking layer.

Similarly, the second branches (270b' and 270b") may include a portion 270b' and the remaining portion 270b" which may have the second sustain electrode 280b overlapped by one end of the second contact hole 76b. The portion 270b' may be used as the light blocking layer.

In some examples, the first sustain electrode line 270a, the first branches (270a' and 270a,") the second sustain electrode line 270b, the second branches (270b' and 270b,") and the first and second sustain electrodes 280a and 280b can collectively be referred to as a sustain electrode wiring (270a, 270a', 270a", 270b, 270b', 270b", 280a, and 280b).

For example, the linewidth of the first sustain electrode line 270a, the remaining portion 270a" of the first branches (270a' and 270a",) the second sustain electrode line 270b and the remaining portion 270b" of the second branches (270b' and 270b") may be reduced as much as possible in order to provide a high aperture ratio. The portion 270a' of the first branches (270a' and 270a") and the portion 270b' of the second branches (270b' and 270b") overlapping the data line 62 may have a linewidth greater than that of the remaining portions (270a" and 270b.") If the portions (270a' and 270b') are used as the light blocking layer, the light block layer may have the same linewidth as that of the portions (270a' and 270b.')

Further, the first and second sustain electrodes 280a and 280b may have a circular-shaped linewidth or a polygonal-shaped linewidth that may be significantly greater than that of the first sustain electrode line 270a and the second sustain electrode line 270b in order to facilitate electrical shorting between the first sub-pixel electrode 80a and the first sustain electrode 280a and between the second sub-pixel electrode 80b and the second sustain electrode 280 during a repairing process.

A gate insulating layer 30 can be disposed on the gate wiring (22a, 22b, 26a, and 26b) and the sustain electrode wiring (270a, 270a', 270a", 270b, 270b', 270b", 280a, and 280b). First semiconductor layer 40a and second semiconductor layer 40b can be disposed on the gate insulating layer 30, and each pair of ohmic contact layers (not shown) can be disposed on the first second semiconductor layer 40a and second semiconductor layer 40b.

The data line 62 can be formed over the pair of the ohmic contact layers and the gate insulating layer 30 and can extend longitudinally to intersect the first gate line 22a and second gate line 22b. The data line 62 can be branched out to form first electrode 65a and second source electrode 65b that can protrude toward first drain electrode 66a and second drain electrode 66b. The data line 62, the first source electrode 65a and the second source electrode 65b, and the first drain electrode 66a and the second drain electrode 66b can collectively be referred to as a data wiring (62, 65a, 65b, 66a, and 66b).

A passivation layer 70 can be formed on the data wiring (62, 65a, 65b, 66a, and 66b) and the exposed portions of the first semiconductor layer 40a and the second semiconductor layer 40b. The passivation layer 70 has the first contact hole 76a and the second contact hole 76b through which the first sub-pixel electrode 80a and the second sub-pixel electrode 80b can be coupled respectively to the first drain electrode 66a and the second drain electrode 66b.

In some examples, a method for repairing an LCD according to exemplary embodiments can be performed in similar manners as described with reference to FIG. 5 and FIG. 6.

Figure 9:
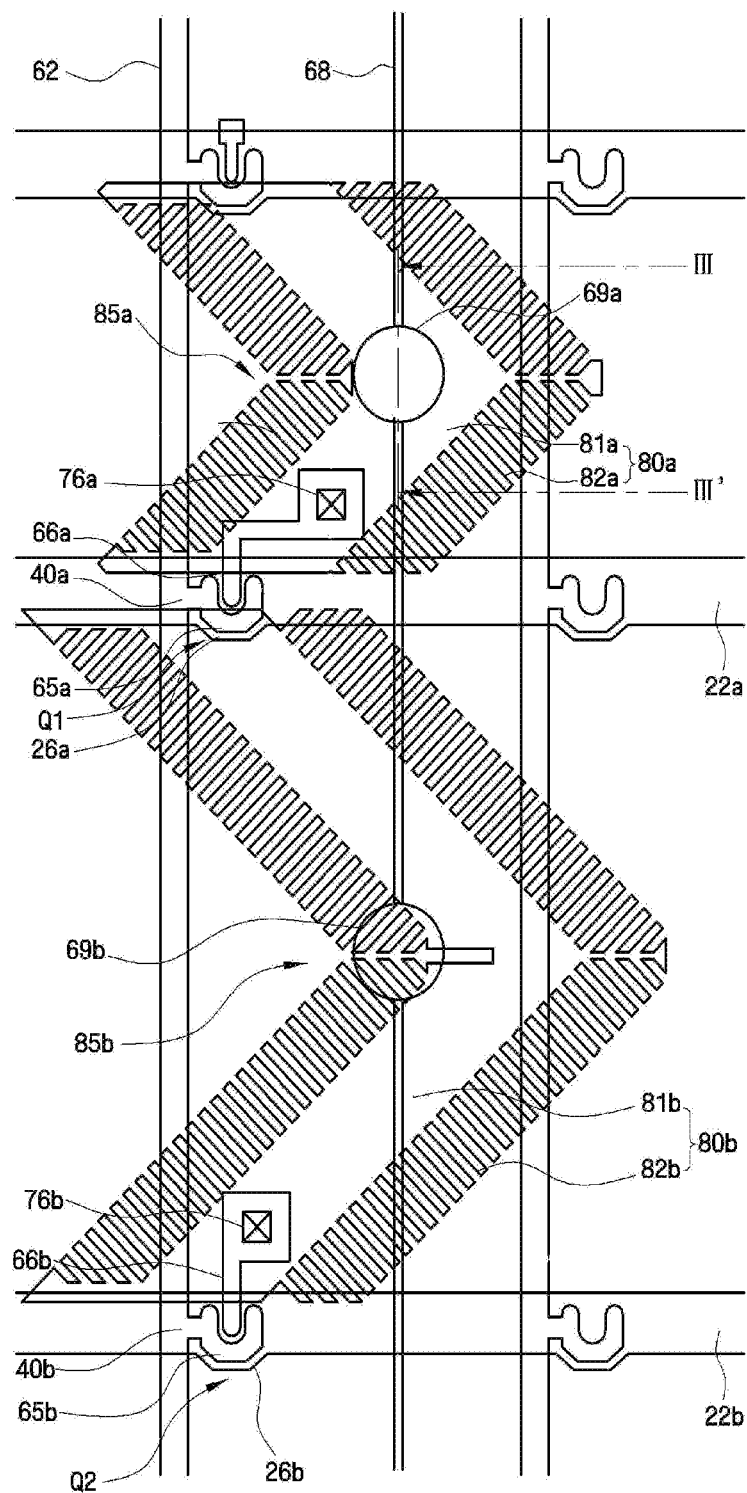
FIG. 9 is a diagram of a TFT substrate of an LCD according to exemplary embodiments of the present invention.
Figure 10:
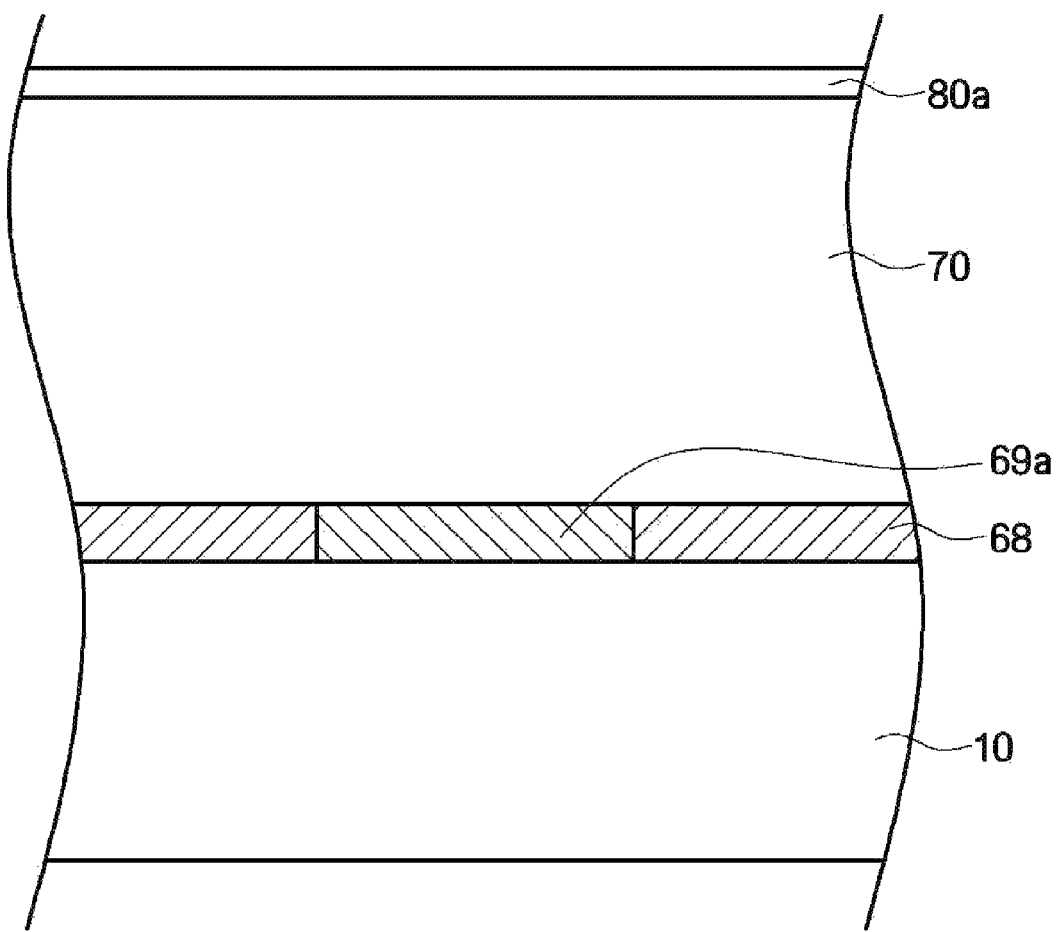
FIG. 10 is a cross-sectional view taken along line III-III' of the TFT substrate of FIG. 9.

FIG. 9 is a diagram of a TFT substrate of an LCD according to exemplary embodiments of the present invention, and FIG. 10 is a cross-sectional view taken along line III-III' of the TFT substrate of FIG. 9. In the following, descriptions of elements identical to those in the previous embodiment shown in FIGS. 1 through 4 can be omitted or simplified to avoid unnecessarily obscuring the present invention.

Referring to FIG. 9 and FIG. 10, a gate wiring (22a, 22b, 26a, and 26b), including first gate line 22a and second gate line 22b and first gate electrode 26a and second gate electrodes 26b, can be formed over a first insulating substrate 10 of the TFT substrate.

A gate insulating layer (not shown) can be disposed on the gate wiring (22a, 22b, 26a, and 26b). A first semiconductor layer 40a and a second semiconductor layer 40b can be disposed on the gate insulating layer, and each pair of ohmic contact layers (not shown) can be disposed on the first semiconductor layer 40a and the second semiconductor layer 40b.

A data line 62 can be formed over the pair of the ohmic contact layers and the gate insulating layer and can extend longitudinally to intersect the first gate line 22a and the second gate line 22b. The data line 62 can be branched out to form first source electrode 65a and second source electrode 65b that can protrude toward first drain electrode 66a and second drain electrode 66b. The data line 62, the first source electrodes 65a and the second source electrode 65b, and the first drain electrode 66a and the second drain electrode 66b can collectively be referred to as a data wiring (62, 65a, 65b, 66a, and 66b).

A sustain electrode line 68 to which a common voltage is applied can be disposed over the gate insulating layer and can extend in the longitudinal direction and parallel to the data line 62. The sustain electrode line 68 may have a first sustain electrode 69a and a second sustain electrode 69b respectively being overlapped by portions of a first sub-pixel electrode 80a and a second sub-pixel electrode 80b and this arrangement may cause to short (e.g., cut) the sustain electrode line 68 from the first sub-pixel electrode 80a and the second sub-pixel electrode 80b. The sustain electrode line 68 and the first sustain electrode 69a and the second sustain electrode 69b can collectively be referred to as a sustain electrode wiring. (68, 69a and 69b) The sustain electrode line 68 may have a minimum linewidth sufficiently to provide an aperture ratio.

The first sustain electrode 69a and the second sustain electrode 69b may have a circular-planar-shaped linewidth or polygonal-planar-shaped linewidth which can significantly be greater than the linewidth of the sustain electrode line 68. A large linewidth of the first sustain electrode 69a and the second sustain electrode 69b can make it easy to short the first sub-pixel electrode 80a and the second sub-pixel electrode 80b respectively from the first sustain electrode 69a and the second sustain electrode 69b during a repairing process by increasing overlapping areas between the first sub-pixel electrode 80a and the first sustain electrode 69a and between the second sub-pixel electrode 80b and the second sustain electrode 69b.

In this example, the first sustain electrode 69a and the second sustain electrode 69b may respectively be overlapped by first bent portion 85a and second bent portion 85b of first sub-pixel electrode 80a and second sub-pixel electrode 80b. Since the transmittance of first bent portion 85a and second bent portion 85b is basically fairly low, the changes of aperture ratio and transmittance of an LCD may be limited—may only slightly be reduced even though the fact that the first sustain electrode 69a and the second sustain electrode 69b lie below the first bent portion 85a and the second bent portion 85b.

A passivation layer 70 can be formed on the data wiring (62, 65a, 65b, 66a, and 66b,) the sustain electrode wiring (68, 69a, and 69b,) and the exposed portions of the first semiconductor layer 40a and the second semiconductor layer 40b. The first sub-pixel electrode 80a and the second sub-pixel electrode 80b can be connected respectively to the first drain electrode 66a and the second drain electrodes 66b through first contact hole 76a and second contact hole 76b.

A method for repairing an LCD according to exemplary embodiments is described with reference to FIG. 9 and FIG. 10.

In similar manners as described with reference FIG. 5 and FIG. 6, the first drain electrode 66a and the second drain electrode 66b can be irradiated with a laser beam and can be cut so that the first sub-pixel electrode 80a and the second sub-pixel electrode 80b can be in a floating state.

For example, by irradiating the portion where the first sustain electrode 69a and second sustain electrode 69b can be located with a laser beam, the first sub-pixel electrode 80a and the second sub-pixel electrode 80b can be shorted respectively from the underlying first sustain electrode 69a and the second sustain electrode 69b. Although the passivation layer 70 is present between each of the first sustain electrode 69a and the second sustain electrode 69b and each of the first sub-pixel electrode 80a and the second sub-pixel electrode 80b, the thickness of the passivation layer 70 may be required to be reduced in order to facilitate electrical shorting.

Figure 11:
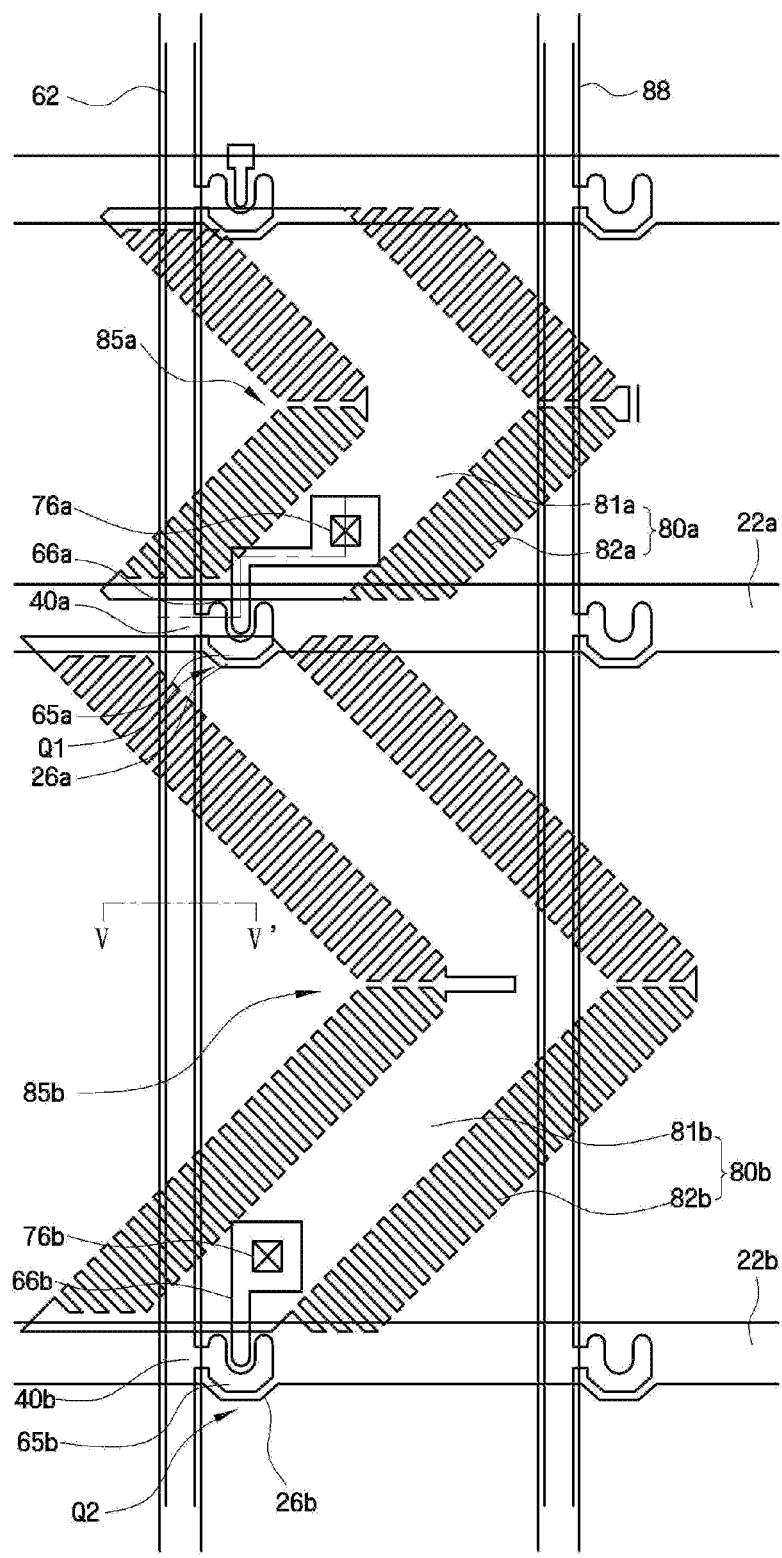
FIG. 11 is a diagram of a TFT substrate in an LCD, according to exemplary embodiments of the present invention.
Figure 12:
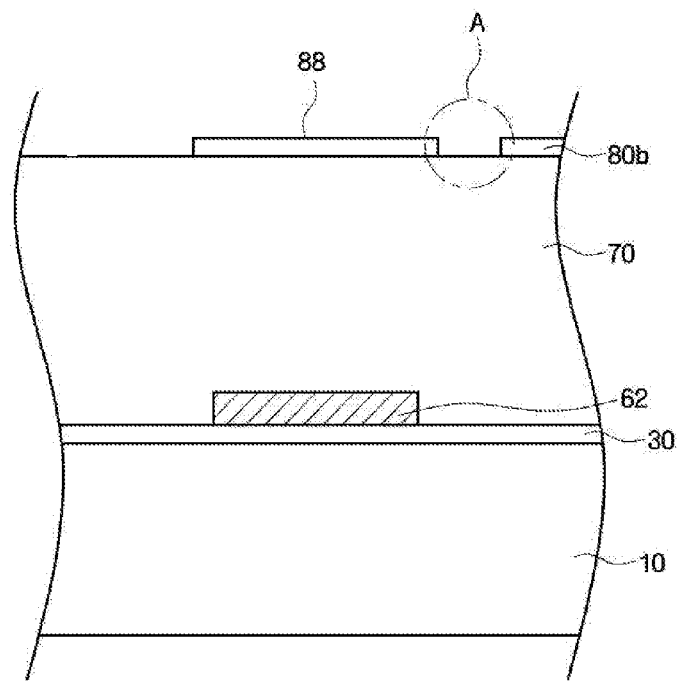
FIG. 12 is a cross-sectional view taken along line V-V' of the TFT substrate of FIG. 11.

FIG. 11 is a diagram of a TFT substrate in an LCD, according to exemplary embodiments of the present invention, and FIG. 12 is a cross-sectional view taken along line V-V' of the TFT substrate of FIG. 11. In the following, descriptions of elements identical to those in the previous embodiment shown in FIG. 1 through FIG. 4 can be omitted or simplified to avoid unnecessarily obscuring the present invention.

Referring to FIG. 11 and FIG. 12, a gate wiring 22a, 22b, 26a, and 26b can be disposed on a first insulating substrate 10 of the TFT substrate and may include a first gate line 22a and a second gate line 22b and a first gate electrode 26a and a second gate electrode 26b.

A gate insulating layer 30 can be disposed on the gate wiring (22a, 22b, 26a, and 26b). First semiconductor layer 40a and second semiconductor layer 40b can be disposed on the gate insulating layer 30, and each pair of ohmic contact layers (not shown) can be disposed on the first semiconductor layer 40a and the second semiconductor layer 40b.

A data line 62 can be formed over the pair of the ohmic contact layers and the gate insulating layer 30 and can be extended longitudinally to intersect the first gate line 22a and the second gate line 22b. The data line 62 can be branched out to form first source electrode 65a and second source electrode 65b that can protrude toward the first drain electrode 66a and the second drain electrode 66b. The data line 62, the first source electrode 65a and the second source electrode 65b, and the first drain electrode 66a and the second drain electrode 66b can collectively be referred to as a data wiring (62, 65a, 65b, 66a, and 66b).

A passivation layer 70 can be formed on the data wiring 62, 65a, 65b, 66a, and 66b, and the exposed portions of the first second semiconductor layer 40a and the second semiconductor layer 40b. The passivation layer 70 may have first contact hole 76a and second contact hole 76b through which the first sub-pixel electrode 80a and the second sub-pixel electrode 80b can be connected respectively to the first drain electrode 66a and the second drain electrode 66b.

A shielding line 88 can be formed on the passivation layer 70 parallel to the data line 62. The shielding line 88 can be formed to minimize coupling capacitance created between the data line 62 and the first sub-pixel electrodes 80a and the second sub-pixel electrode 80b, and can receive a common voltage. The shielding line 88 may be formed of the same or a similar material as the first sub-pixel electrode 80a and second sub-pixel electrode 80b.

A method for repairing an LCD according to exemplary embodiments is described with reference to FIG. 11 and FIG. 12.

In the similar manners as described with reference FIG. 5 and FIG. 6, the first drain electrode 66a and the second drain electrode 66b can be irradiated with a laser beam and can be cut so that the first sub-pixel electrode 80a and the second sub-pixel electrode 80b can be in floating states.

For example, by using a Chemical Vapor Deposition (CVD) repair apparatus, a conductive pattern (not shown) can be formed at an area ('A') above the passivation layer 70, and can be formed, for example, between shielding line 88 and the first sub-pixel electrode 80a and between shielding line 88 and the second sub-pixel electrode 80b. Thus, an electrical short can be performed between the shielding line 88 where the common voltage can be applied and the first sub-pixel electrode 80a and second sub-pixel electrode 80b for a repairing process.

In some examples, the above structures illustrated in FIG. 5 through FIG. 12 can be applied to a structure of the LCD without having sustain electrode lines shown in FIG. 1 through FIG. 4. For example, the same structure or a similar structure illustrated in FIG. 5 through FIG. 12 can be applied even if a sustain electrode line has a limited small linewidth so as to perform a short repairing process.

An LCD and a method for performing a repairing process without modifying the structure of a TFT substrate described above with reference to FIG. 1 through FIG. 4 is described with reference to FIG. 13.

Figure 13:
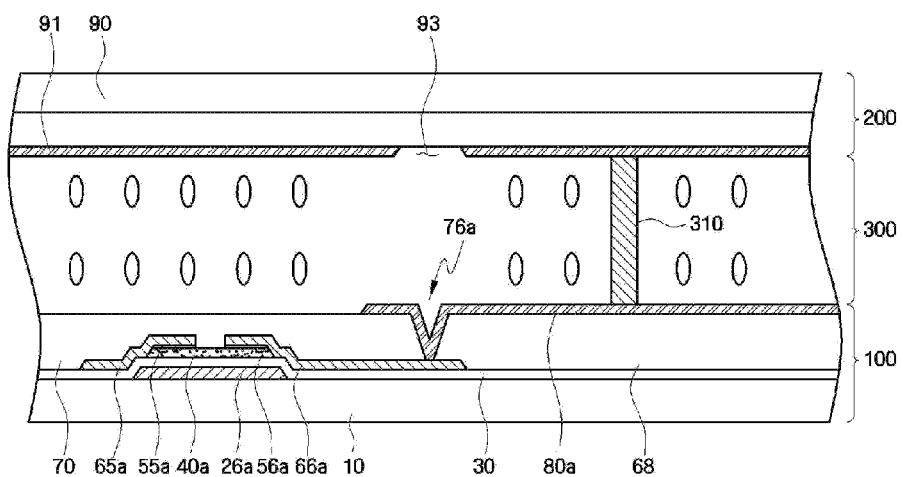
FIG. 13 is a cross-sectional view taken along line IV-IV' of the LCD of FIG. 1.

FIG. 13 is a cross-sectional view taken along line IV-IV' of the LCD of FIG. 1 and illustrates the LCD fabricated using the repairing method according to exemplary embodiments.

Referring to FIG. 13, the TFT substrate 100 and the color filter substrate 200 may be provided.

As described above, the TFT substrate 100 may include a gate wiring (22a, 22b, 26a, and 26b,) a gate insulating layer 30, semiconductor layers 40a and 40b, ohmic contact layers (55a and 56a,) a data wiring (62, 65a, 65b, 66a, and 66b,) a passivation layer 70 and a pixel electrode (80a and 80b,) respectively connected to the drain electrodes 66a and 66b via the contact holes 76a and 76b, which can be sequentially formed on an insulating substrate 10. The color filter substrate 200 may include an insulating substrate 90 and a common electrode 91 disposed to face the pixel electrode (80a and 80b) and the color filter substrate 200 may have an shape corresponding to the shape of the pixel electrodes (80a and 80b).

If the pixel electrodes 80a and 80b are determined as defective, the drain electrodes (66a and 66b) can be cut by laser irradiation and a CVD repair apparatus can be used to form a conductive pattern 310 having a predetermined height on a portion of the pixel electrodes (80a and 80b) of the TFT substrate 100. In this example, the height of the conductive pattern 310 corresponds to a distance between the TFT substrate 100 and the color filter substrate 200 when attached to each other. The conductive pattern 310 may be a metal bead.

For example, instead of forming the conductive pattern 310 on the pixel electrode 80a and 80b, the conductive pattern 310 may be formed on a portion of the common electrode 91 of the color filter substrate 200.

In some examples, the TFT substrate 100 and the color filter substrate 200 can be cemented together. In this example, the conductive pattern 310 can be formed on one of the TFT substrate 100 and the color filter substrate 200 may directly connect the pixel electrodes (80a and 80b) to the common electrode 91 so that the pixel electrodes (80a and 80b) may have the same electric potential as that of the common electrode 91. In this manner, a short repairing process can be performed.

A liquid crystal material can be injected into a space between the TFT substrate 100 and the color filter substrate 200 to form the liquid crystal layer 300.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display (LCD) comprising:
    a gate line extending in a first direction;
    a data wiring, insulated from the gate line, the data wiring comprising a source electrode, a drain electrode, and a data line, the data line extending in a second direction;
    a pixel electrode coupled to the drain electrode via a contact hole, the pixel electrode and the drain electrode overlapping at the contact hole;
    and
    a sustain electrode line disposed substantially coplanar with the gate line, the sustain electrode line comprising a sustain electrode overlapped by the contact hole.

2. The LCD of claim 1, wherein a linewidth of the sustain electrode exceeds a linewidth of the sustain electrode line.

3. The LCD of claim 1, wherein the sustain electrode line extends in the first direction as the gate line.

4. The LCD of claim 1, wherein the pixel electrode comprises at least one bent portion and the sustain electrode line comprises a first line and a second line, the first line extending across the bent portion and the second line branching out from the first line toward the contact hole.

5. The LCD of claim 1, wherein the gate line comprises a first gate line and a second gate line extending in the first direction and parallel to each other, and
    wherein the pixel electrode comprises a first sub-pixel electrode and a second sub-pixel electrode, wherein the first sub-pixel electrode is defined by the first gate line and the data line, and the second sub-pixel electrode is defined by the second gate line and the data line.

6. The LCD of claim 5, wherein each of the first sub-pixel electrode and the second sub-pixel electrode comprises at least one bent portion.

7. A method for repairing a liquid crystal display (LCD), the method comprising:
providing a gate line extending in a first direction, wherein a data wiring, insulated from the gate line, comprises a source electrode, a drain electrode, and a data line, the data line extending in a second direction;
disposing a pixel electrode coupled to the drain electrode via a contact hole, the pixel electrode and the drain electrode overlapping at the contact hole, wherein a sustain electrode line is disposed substantially coplanar with the gate line, the sustain electrode overlapped by the contact hole; and
cutting the drain electrode and irradiating a laser beam into a portion where the contact hole is located so as to short the pixel electrode with the sustain electrode if the pixel electrode is determined as defective,
wherein the drain electrode is cut at a neck portion not overlapped by the contact hole.

8. A display comprising:
a gate line, extending in a first direction, and a data wiring, insulated from the gate line, the data wiring comprising a source electrode, a drain electrode and a data line, the data line extending in a second direction; and
a pixel electrode coupled to the drain electrode via a contact hole, the pixel electrode and the drain electrode overlapping at the contact hole, and a sustain electrode line, disposed on substantially the same plane with the gate line, comprising a sustain electrode overlapped by the contact hole, wherein the drain electrode is cut at a neck portion not overlapped by the contact hole and the pixel electrode is shorted with the sustain electrode at the contact hole.

9. A display device, comprising:
a gate line disposed on a substrate and extending in a first direction;
a data wiring, insulated from the gate line, the data wiring comprising a source electrode, a drain electrode, and a data line, the data line extending in a second direction;
a pixel electrode coupled to the drain electrode via a contact hole, the pixel electrode and the drain electrode overlapping at the contact hole; and
a sustain electrode line disposed on the substrate and comprising a sustain electrode overlapped by the contact hole.

10. The display device of claim 9, further comprising a gate insulating layer disposed between the sustain electrode and the drain electrode.

11. The display device of claim 10, wherein a linewidth of the sustain electrode exceeds a linewidth of the sustain electrode line.

12. The display device of claim 11, wherein the drain electrode comprises a first portion and a second portion, the second portion extending from the first portion, being wider than the first portion, and being disposed on the sustain electrode.

* * * * *